(12) United States Patent
Henrion et al.

(10) Patent No.: US 6,323,734 B1
(45) Date of Patent: Nov. 27, 2001

(54) TRANS-IMPEDANCE AMPLIFIER

(75) Inventors: W. S. Henrion; Phillip J. Kruczkowski, both of Austin, TX (US); Subhajit Sen, Banglore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/515,549

(22) Filed: Feb. 29, 2000

(51) Int. Cl.[7] .............................. H03F 3/08; H01J 40/14
(52) U.S. Cl. .................................. 330/308; 250/124 R
(58) Field of Search .......................... 330/69, 308, 310; 250/214 A

(56) References Cited

U.S. PATENT DOCUMENTS

| | | | |
|---|---|---|---|
| 5,561,288 | * 10/1996 | Stevens | 250/214 A |
| 5,570,221 | * 10/1996 | Fujita | 250/214 A |
| 5,892,609 | * 4/1999 | Saruwatari | 330/308 |
| 5,955,918 | * 9/1999 | Uno | 330/308 |
| 5,982,232 | * 11/1999 | Rogers | 330/308 |
| 5,990,737 | * 11/1999 | Czarmul et al. | 330/69 |

OTHER PUBLICATIONS

Bandwidth Enhancement of Transimpedance Amplifier by a Capacitive–Peaking Design, By Feng–Tso Chien and Yi–Jen Chan, IEEE Journal of Solid–State Circuits, vol. 34, No. 8, Aug. 1999, pp. 1167–1170.

A CMOS Optical Preamplifier for Wireless Infrared Communications, By Khoman Phang and David A. Johns, IEEE Transactions on Circuits and Systems–II: Analog and Digital Signal Processing, vol. 46, No. 7, Jul. 1999, pp. 852–859.

Wide–Band Integrated Optical Receiver with Improved Dynamic Range Using a Current Switch at the Input, By L.A.D. van den Broeke and A. J. Nieuwkerk, IEEE Journal of Solid–State Circuits, vol. 28, No. 7, Jul. 1993, pp. 862–854.

A Wideband Low–Noise Variable–Gain BiCMOS Transimpedance Amplifier, By Robert G. Meyer and William D. Mack, IEEE Journal of Solid–State Circuits, vol. 29, No. 6, Jun. 1994, pp. 701–706.

A. 1.06Gb/s–32dBm to 0dBm BiCMOS Optical Preamplifier Featuring Adaptive Transimpedance, By Haideh Khorramabadi et al., ISSCC95/Session 3/Analog Techniques/Paper WP3.4, 1995.

* cited by examiner

Primary Examiner—Robert Pascal
Assistant Examiner—Khanh Van Nguyen
(74) Attorney, Agent, or Firm—Christopher P. Maiorana, P.C.

(57) ABSTRACT

An apparatus comprising a detector circuit and a first circuit. The detector circuit may be configured to (i) provide a bias voltage and (ii) generate a plurality of first signals and a plurality of second signals. The first circuit may be configured to (a) present (i) the bias voltage and (ii) a differential signal in response to the plurality of first signals and the plurality of second signals and (b) control (i) one or more of the plurality of first signals and (ii) one or more of the plurality of second signals.

19 Claims, 2 Drawing Sheets

US 6,323,734 B1

TRANS-IMPEDANCE AMPLIFIER

FIELD OF THE INVENTION

The present invention relates to a method and/or architecture for implementing a trans-impedance amplifier (TIA) generally and, more particularly, to a TIA that may provide a trans-impedance for an optical detector diode.

BACKGROUND OF THE INVENTION

Conventional TIA circuits implement AC coupling and external biasing. AC coupling comprises a number of additional capacitors. External biasing comprises a number of additional resistors. There are many disadvantages to conventional TIA circuits. Conventional TIA circuits require a large capacitance (i.e., capacitors) for AC coupling. The larger capacitors are too large for integrated circuit implementation and therefore require external coupling capacitors. Conventional TIA circuits require low value biasing resistors, resulting in implementation of external bias resistors. Conventional TIA circuits provide poor power supply and substrate noise rejection. Furthermore, conventional TIA circuits often present an "under shoot" condition since the output signal is always in one direction (a single ended output signal).

SUMMARY OF THE INVENTION

The present invention concerns an apparatus comprising a detector circuit and a first circuit. The detector circuit may be configured to (i) detect a bias voltage and (ii) generate a plurality of first signals and a plurality of second signals. The first circuit may be configured to (a) present (i) the bias signal and (ii) a differential signal in response to the plurality of first signals and the plurality of second signals and (b) control (i) one or more of the plurality of first signals and (ii) one or more of the plurality of second signals.

The objects, features and advantages of the present invention include providing an architecture and/or method that may provide (i) a trans-impedance gain for a detector diode signal, (ii) a DC bias required for the diode, (iii) a differential input to maximize signal to power supply, and/or (v) substrate noise.

The present invention may also provide an architecture and/or method that may provide an optical diode detector with (i) a reverse bias of several volts to minimize junction capacitance, (ii) a very low input impedance load to minimize an RC time constant of the optical diode parasitic capacitance and input resistance and/or (iii) a wide dynamic range (e.g., 80 dB) from 200 nAmps to 2 mA.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
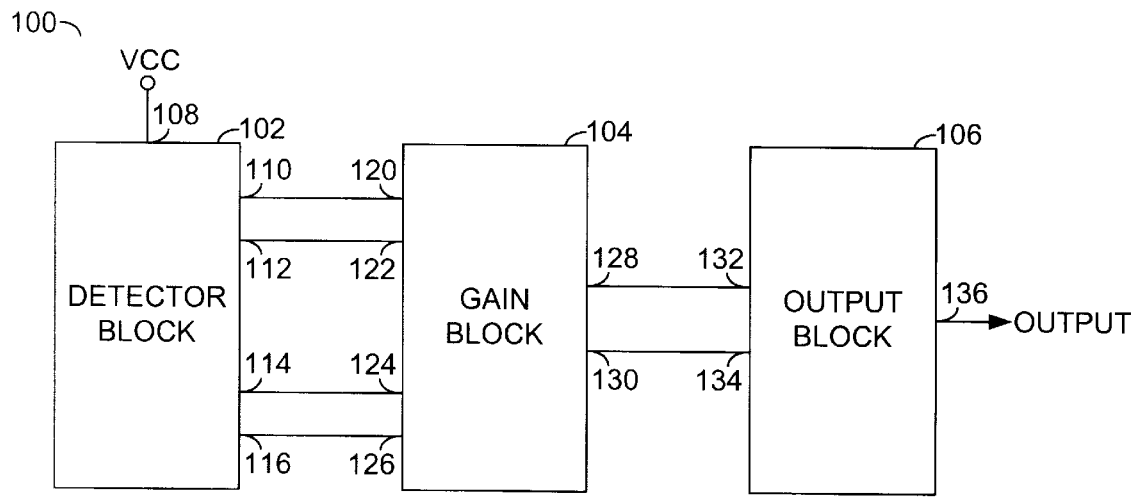
FIG. 1 is a block diagram of a preferred embodiment of the present invention.

Referring to FIG. 1, a block diagram of a circuit 100 is shown in accordance with a preferred embodiment of the present invention. The circuit 100 may be implemented, in one example, as a trans-impedance amplifier (TIA) circuit. In one example, the circuit 100 may provide a trans-impedance gain for an optical detector diode 138. The circuit 100 may additionally provide a DC bias required by the diode. The circuit 100 may provide the DC bias without a need to AC couple the diode to the circuit 100, while providing a differential input to maximize the signal to thermal noise. Additionally, the circuit 100 may provide maximum power supply and substrate noise rejection.

The circuit 100 may comprise a detector block (or circuit) 102, a gain block (or circuit) 104 and an output block (or circuit) 106. The detector block 102 may be configured to provide bias voltages for gain block 104. The detector block 102 may have an input 108 that may receive a supply voltage (e.g., VCC). The supply voltage VCC may be implemented as, in one example, a 5 volt supply. However, other supply voltages (e.g., 3.3v, 2.0v, 1.8v, 1.2v, 1.0v, etc.) may be implemented accordingly to meet the design criteria of a particular application. The detector block 102 may have an input/output 110, an output 112, an output 114 and an input/output 116.

The gain block 104 may comprise an input/output 120, an input 122, an input 124 and an input/output 126. The input/output 110 may present a signal to the input/output 120. The output 112 may present a signal to the input 122. The output 114 may present a signal to the input 124. The input/output 116 may present a signal to the input/output 126. The gain block 104 may additionally comprise an output 128 and an output 130. In one example, the gain block 104 may be configured to generate a differential signal at the outputs 128 and 130.

The output block 106 may be implemented as a limiter or compression output circuit. The output block 106 may have an input 132 and an input 134. The output 128 may present a signal to the input 132. The output 130 may present a signal to the input 134. The inputs 132 and 134 may be implemented, in one example, as a differential input pair. The output block 106 may present a signal (e.g., OUTPUT) at an output 136. The signal OUTPUT may be a differential output signal presented at the outputs 136a and 136b. The differential output signal OUTPUT may be presented to an external chip or device (not shown). The output block 106 may be implemented to present a maximized differential output signal in response to the differential input pair (e.g., the inputs 132 and 134). The output block 106 may provide a high power supply rejection ratio (PSRR) and minimal ground noise coupling.

Figure 2:
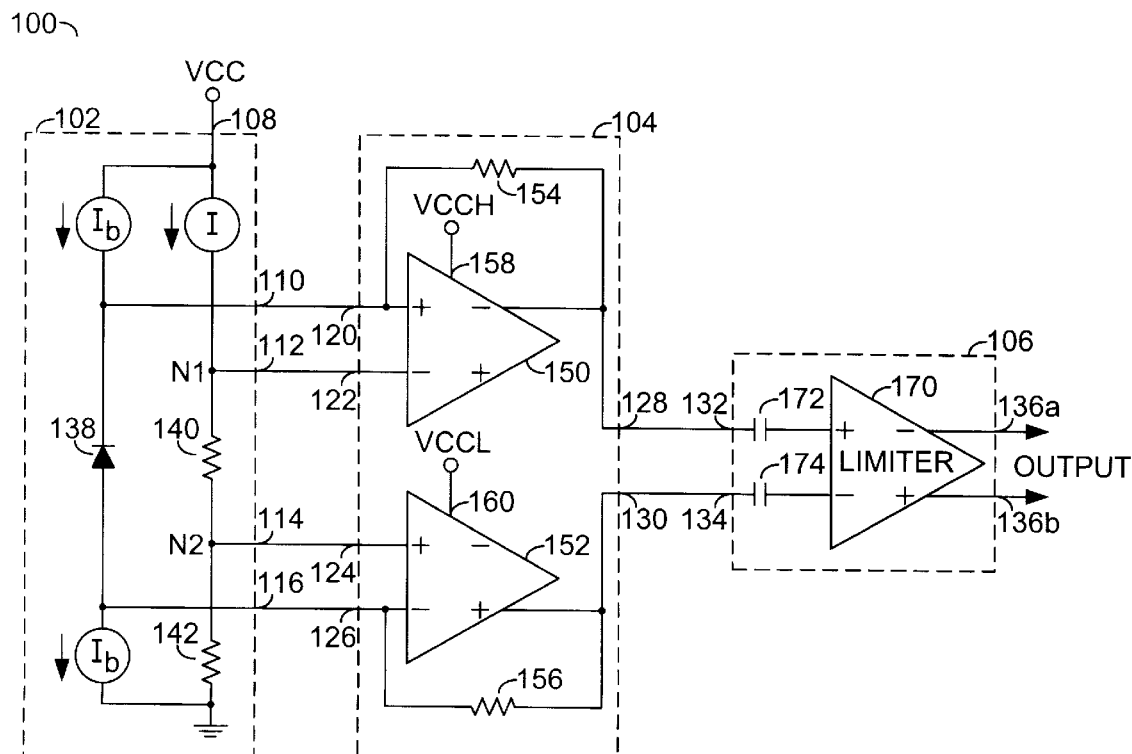
FIG. 2 is a detailed block diagram of the circuit of FIG. 1.

Referring to FIG. 2 a detailed block diagram of the circuit 100 is shown. The detector block 102 may comprise a diode 138, a resistor 140, a resistor 142, a node (e.g., N1) and a node (e.g., N2). The resistors 154 and 156 may be implemented, in one example, as 0.2KΩ, 1.6KΩ, 3.2KΩ, etc., which is approximately the trans-impedance of the circuit 100. However, the resistors 140 and 142 may be implemented as other appropriate resistances in order to meet the criteria of a particular implementation. In one example, the node N1 may have a voltage of 4.1 volts and the node N2 may have a voltage of 1.1 volts. However, the voltages of the nodes N1 and N2 may be varied accordingly in order to meet the criteria of a particular detector diode and not exceed the limits of the integration process.

A current (e.g., I) may be presented to a first side of the resistor 140. The current I may have an associated voltage across the resistor 140. For example, the first side of the resistor 140 may be at the voltage of the node N1. The voltage at the node N1 may be presented to the output 112. A second side of the resistor 140 may be at the voltage of the node N2. Additionally, the voltage at the node N2 may be presented to the output 114. The voltage at the node N2 may be presented to a first side of the resistor 142. A second side of the resistor may be connected to ground.

A current (e.g., Ib) may be presented to the diode 138. The current Ib may be implemented as a bias current. The bias current Ib may have an associated bias voltage over the diode 138. The diode 138 may be implemented, in one example, as an optical PIN diode. The optical PIN diode 138 may require a reverse bias voltage to operate properly. The reverse bias voltage may be in the order of 3 volts (e.g., 3.5–4.5 volts, 3–5 volts, etc.). However, the reverse bias voltage may be varied accordingly in order to meet the criteria of a particular implementation. The reverse bias voltage may be implemented to control the gain block 104. The reverse bias voltage may minimize a junction capacitance of the circuit 100.

The gain block 104 may comprise an amplifier 150, an amplifier 152, a resistor 154 and a resistor 156. The amplifiers 150 and 152 may each be implemented as a differential bipolar amplifier, MOS amplifier or any other type amplifier in order to meet the design criteria of a particular implementation. The input/output 120 may present/receive the bias current and/or voltage from the input/output 110. The input 122 may receive the voltage at the node N1. The input 124 may receive the voltage at the node N2. The input/output 126 may present/receive the bias current and/or voltage at the input/output 116.

The signal presented to the input/output 120 may be presented to a first input (e.g., a positive input) of the amplifier 150. The signal presented to the input 122 may be presented to a second input (e.g., a negative input) of the amplifier 150. Additionally, the amplifier 150 may receive a supplement voltage (e.g., VCCH) at an input 158.

The signal received from the input 124 may be presented to a first input (e.g., a positive input) of the amplifier 152. The signal received from the input/output 126 may be presented to a second input (e.g., a negative input) of the amplifier 152. Additionally, the amplifier 152 may have an input 160 that may receive a supplement voltage (e.g., VCCL). In one example, the voltage VCCH may be implemented as a 5 volt supply and the voltage VCCL may be implemented as a 3.3 volt supply. However, the voltages of the supplemental voltages VCCH and VCCL may be implemented as other appropriate voltages needed to meet the criteria of a particular implementation. The resistors 154 and 156 may each be implemented having an appropriate resistance needed in order to meet the criteria of a particular implementation.

The amplifiers 150 and 152 may each be configured to provide a voltage to bias the diode 138. The bias is generally provided by the amplifier 150 and the amplifier 152. The differential amplifier 152 may be biased to provide a smaller positive voltage to one side of the diode 138. The differential amplifier 150 may be biased to provide a more positive voltage to the other side of the diode 138.

The amplifiers 150 and 152 in combination may be implemented as a trans-impedance amplifier. The gain block 104 may be implemented as a trans-impedance amplifier. The two current sources I and Ib may be implemented to provide biasing to the gain block 104 in order to increase headroom for the amplifiers 150 and 152. The currents I and Ib may be implemented to increase the headroom of the gain block 104, since the current through the diode 138 is normally directed from a cathode to an anode.

Figure 3:
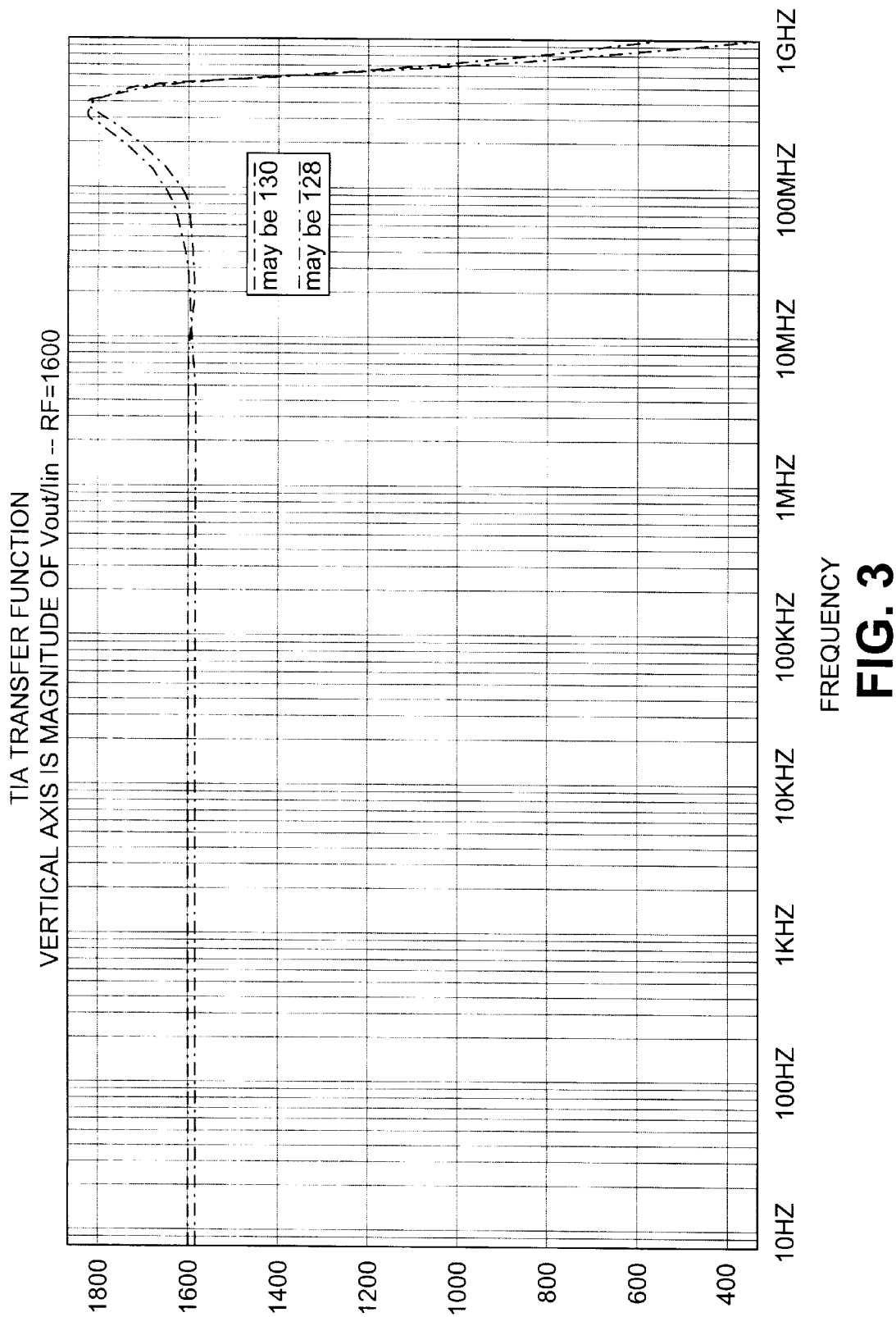
FIG. 3 is a diagram of a transfer function of the circuit of FIG. 1.

A transfer function of the gain circuit 104 may be equivalent to the resistive values of the resistors 154 and/or 156. FIG. 3 illustrates an example of such a transfer function. The value of the resistor 154 and/or 156 may be implemented as an arbitrary resistance (e.g., Rf). The vertical axis of FIG. 3 illustrates a magnitude of Vout/Iin, with a value of Rf =1.6KΩ. The horizontal axis shows a frequency (in Hertz). The input impedance of the gain block 104 may be Rf/Av, where Av is the open loop gain of the gain circuit 104. The input impedance of the gain circuit 104 (e.g., the amplifiers 150 and 152) may need to be as low as possible, because of (i) a large parasitic capacitance of the optical PIN diode 138, (ii) additional ESD diodes parasitic capacitance and/or (iii) an input capacitance of the external chip. A negative output of the differential amplifier 150 may be connected to the output 128. A positive output of the differential amplifier 152 may be connected to the output 130. The gain circuit 104 may present a differential input to the output block 106 at the outputs 128 and 130, respectively.

The output block 106 may comprise an amplifier 170, a capacitor 172 and a capacitor 174. The amplifier 170 may be implemented as a limiting amplifier. The amplifier 170 may be implemented, in one example, as a differential amplifier, MOS amplifier or any other type amplifier in order to meet the criteria of a particular implementation. The amplifier 170 may receive the signal from the input 132 at a first input (e.g., a positive input) through the capacitor 172. The amplifier 170 may receive the signal from the input 134 at a second input (e.g., a negative input) through the capacitor 174. The capacitors 172 and 174 may each be implemented, in one example, as small on chip capacitors. The small on chip capacitors 172 and 174 may allow the circuit 100 to avoid additional external AC coupling of larger capacitors. The outputs of the differential amplifiers 150 and 152 may be AC coupled to the limiting amplifier 170 through the capacitors 172 and 174.

The limiting amplifier 170 may have an output (e.g., a negative output) connected to the output 136a. The limiting amplifier 170 may have an output (e.g., a positive output) connected to the output 136b. The limiting amplifier 170 may provide the differential output signal OUTPUT at the output 136 (e.g., outputs 136a and 136b). The limiting amplifier 170 may maximize the differential output signal OUTPUT while maintaining a high PSRR and minimal ground noise coupling.

The circuit 100 may provide an architecture and/or method where the optical PIN diode 138 may be directly biased from the chip which contains the circuit 100. The circuit 100 may allow direct biasing without large capacitors coupled between the optical PIN diode 138 and the chip which contains the circuit loo. The circuit 100 may not require additional external bias resistors. The circuit 100 may allow a physical interface of any optical receiver to be integrated with a serializer/deserializer chip. The circuit 100 may allow a wider bandwidth to be obtained due to direct coupling of the diode 138. The circuit 100 may additionally be implemented in an all DC coupled systems that may allow an unbalanced code to be transmitted on a fiber network.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a detector circuit configured to (i) detect a bias voltage and (ii) generate an offset current bias, a plurality of first signals and a plurality of second signals; and a first circuit configured to (a) present (i) said bias voltage and (ii) a differential signal in response to said offset current bias, said plurality of first signals and said plurality of second signals and (b) control (i) one or more of said plurality of first signals and (ii) one or more of said plurality of second signals.

2. The apparatus according to claim 1, further comprising an output circuit configured to present a differential output signal in response to said differential signal.

3. The apparatus according to claim 2, wherein said first circuit comprises a trans-impedance amplifier, wherein said trans-impedance amplifier comprises a first amplifier and a second amplifier.

4. The apparatus according to claim 3, wherein said first amplifier and said second amplifier each comprise a differential bipolar amplifier.

5. The apparatus according to claim 3, wherein said first amplifier and said second amplifier each comprise a MOS amplifier.

6. The apparatus according to claim 3, wherein one or more of said plurality of first signals and one or more of said plurality of second signals comprise said bias voltage.

7. The apparatus according to claim 6, wherein said detector circuit comprises a diode and is further configured to bias said diode in response to said bias voltage, wherein said diode comprises an optical PIN diode.

8. The apparatus according to claim 6, wherein said first amplifier and said second amplifier are each biased to provide said bias voltage, wherein said bias voltage comprises a bias signal.

9. The apparatus according to claim 8, wherein said first amplifier and said second amplifier are each further configured to increase the headroom of said first circuit in response to said offset current bias.

10. The apparatus according to claim 9, wherein said first circuit is configured to provide a trans-impedance gain for said diode.

11. The apparatus according to claim 2, wherein said output circuit comprises an amplifier, a first capacitor and a second capacitor, wherein said first and second capacitors are each coupled to a first and a second input of said amplifier.

12. The apparatus according to claim 11, wherein said amplifier comprises a limiting amplifier.

13. The apparatus according to claim 11, wherein said amplifier is configured to present said output signal, wherein said output signal is configured to (i) maximize a signal to thermal noise threshold, (ii) provide a maximum power supply noise rejection and (iii) provide a reduced substrate noise coupling.

14. An apparatus comprising:

means for detecting a bias voltage and generating an offset current bias, a plurality of first signals and a plurality of second signals; and means for (a) presenting (i) said bias voltage and (ii) a differential signal in response to said offset current bias, said plurality of first signals and said plurality of second signals and (b) controlling (i) one or more of said plurality of first signals and (ii) one or more of said plurality of second signals.

15. A method for a trans impedance amplifier providing a trans impedance gain for a diode comprising the steps of:

(A) detecting a bias voltage and generating an offset current bias, a plurality of first signals and a plurality of second signals;

(B) presenting (i) said bias voltage and (ii) a differential signal in response to said offset current bias, said plurality of first signals and said plurality of second signals; and (C) controlling (i) one or more of said plurality of first signals and (ii) one or more of said plurality of second signals.

16. The method according to claim 15, further comprising the step of:

presenting an output signal in response to said differential signal.

17. The method according to claim 15, wherein step (A) further comprises biasing said diode in response to said bias voltage.

18. The method according to claim 17 further comprising the step of:

biasing a first amplifier and/or a second amplifier to provide said bias voltage.

19. The method according to claim 15 further comprising the step of:

providing (i) said offset current bias to increase a head room threshold and (ii) a trans-impedance gain for said diode.

* * * * *